(12) United States Patent
Patil et al.

(10) Patent No.: US 11,832,391 B2
(45) Date of Patent: Nov. 28, 2023

(54) TERMINAL CONNECTION ROUTING AND METHOD THE SAME

(71) Applicant: QUALCOMM Incorporated, San Diego, CA (US)

(72) Inventors: Aniket Patil, San Diego, CA (US); Hong Bok We, San Diego, CA (US); Joan Rey Villarba Buot, Escondido, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 51 days.

(21) Appl. No.: 17/038,173

(22) Filed: Sep. 30, 2020

(65) Prior Publication Data

US 2022/0104359 A1   Mar. 31, 2022

(51) Int. Cl.
*H05K 1/18*    (2006.01)
*H05K 3/30*    (2006.01)

(52) U.S. Cl.
CPC ............ *H05K 1/181* (2013.01); *H05K 3/303* (2013.01); *H05K 2201/10522* (2013.01)

(58) Field of Classification Search
CPC .. H05K 1/18; H05K 1/181–187; H05K 3/303; H05K 2201/10522
USPC ........ 361/760–764, 816, 818, 782–784, 800; 257/660–690
See application file for complete search history.

(56) References Cited

U.S. PATENT DOCUMENTS

| | | | | |
|---|---|---|---|---|
| 4,717,990 A | * | 1/1988 | Tugcu | H05K 9/0037 361/752 |
| 5,252,782 A | * | 10/1993 | Cantrell | H05K 9/0033 361/818 |
| 5,566,055 A | * | 10/1996 | Salvi, Jr. | H05K 9/003 174/358 |
| 6,218,729 B1 | | 4/2001 | Zavrel, Jr. et al. | |

(Continued)

FOREIGN PATENT DOCUMENTS

| | | |
|---|---|---|
| JP | 2001335951 A | 12/2001 |
| KR | 20150114924 A | 10/2015 |

OTHER PUBLICATIONS

International Search Report and Written Opinion—PCT/US2021/048248—ISA/EPO—dated Dec. 6, 2021.

*Primary Examiner* — Tuan T Dinh
(74) *Attorney, Agent, or Firm* — Muncy, Geissler, Olds & Lowe, P.C.

(57) ABSTRACT

Terminal connection routing on top of a substrate surface connects to component terminals to and from PMIC devices and provides a novel structure to connect surface mount technology (SMT) passive device terminals on an SMT layer (such as a Cu bar mesh) that uses the 3D space available near to components to lower resistance/lower inductive path and provides a shorter path, SIP form factor reduction, a component placement density increase, creates an additional PDN layer for connectivity and, if the routing is encapsulated in a mold, protects the metal in the connection from oxidation. Methods are presented for providing a substrate, attaching a first device to a first surface of the substrate near a center of the substrate, attaching a second device to the first surface of the substrate near an edge of the substrate, and connecting a connection located on the first surface of the substrate between the first device and the second device.

28 Claims, 8 Drawing Sheets

(56) References Cited

U.S. PATENT DOCUMENTS

| | | | | |
|---|---|---|---|---|
| 7,679,935 | B2* | 3/2010 | Horng | H05K 9/0049 |
| | | | | 361/753 |
| 9,040,337 | B2* | 5/2015 | Park | H01L 23/5387 |
| | | | | 438/437 |
| 9,089,046 | B2* | 7/2015 | Chen | H05K 3/284 |
| 9,455,209 | B2* | 9/2016 | Mugiya | H05K 3/284 |
| 10,306,755 | B2* | 5/2019 | Ogura | H05K 1/0281 |
| 2007/0246825 | A1* | 10/2007 | Oh | H01L 25/165 |
| | | | | 257/E23.125 |
| 2012/0008288 | A1* | 1/2012 | Tsukamoto | H05K 9/0037 |
| | | | | 361/736 |
| 2014/0209361 | A1 | 7/2014 | Nakai et al. | |
| 2014/0299362 | A1* | 10/2014 | Park | H05K 1/0283 |
| | | | | 174/254 |
| 2015/0043171 | A1* | 2/2015 | Mugiya | H01L 24/97 |
| | | | | 361/728 |
| 2015/0102891 | A1* | 4/2015 | Yoon | H01F 27/2804 |
| | | | | 336/200 |
| 2015/0255416 | A1* | 9/2015 | Kim | H01L 24/24 |
| | | | | 438/126 |
| 2015/0303132 | A1 | 10/2015 | Michael et al. | |
| 2016/0095267 | A1* | 3/2016 | Kitazaki | H05K 1/0216 |
| | | | | 361/760 |
| 2017/0263573 | A1 | 9/2017 | Kim et al. | |
| 2018/0092257 | A1* | 3/2018 | Otsubo | H05K 9/0024 |

* cited by examiner

TERMINAL CONNECTION ROUTING AND METHOD THE SAME

FIELD OF DISCLOSURE

This disclosure relates generally to system in package (SIP) applications, and more specifically, but not exclusively, to terminal connection routing for a SIP.

BACKGROUND

Power management integrated circuits (PMICs) are integrated circuits for power management. Although PMIC refers to a wide range of chips (or modules in SIP devices), most include several voltage converters or their control part. A PMIC is often included in battery-operated devices such as mobile phones and portable media players to decrease the amount of space required. However, in the substrate routing for PMIC devices, all inductors must be near the PMIC device for lower direct current resistance (DCR). This puts a limitation on the efficient utilization of space on the PMIC substrate and leads to substrate floor plan area wastage. Thus, conventional PMIC systems need to place some inductors in far corner regions to make compact modules since the corners generally have some unused space. Unfortunately, placing inductors in the corner regions increases the DCR.

Accordingly, there is a need for systems, apparatus, and methods that overcome the deficiencies of conventional approaches including the methods, system and apparatus provided hereby.

SUMMARY

The following presents a simplified summary relating to one or more aspects associated with the apparatus and methods disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the apparatus and methods disclosed herein in a simplified form to precede the detailed description presented below.

In one aspect, an apparatus includes: a substrate; a first device attached to a first surface of the substrate near a center of the substrate; a second device attached to the first surface of the substrate near an edge of the substrate; and a connection located on the first surface of the substrate, the connection coupled between the first device and the second device.

In another aspect, an apparatus includes: means for supporting; a first device attached to a first surface of the means for supporting near a center of the means for supporting; a second device attached to the first surface of the means for supporting near an edge of the means for supporting; and means for connection located on the first surface of the means for supporting, the means for connection coupled between the first device and the second device.

In still another aspect, a method for manufacturing an apparatus that includes: providing a substrate; attaching a first device to a first surface of the substrate near a center of the substrate; attaching a second device to the first surface of the substrate near an edge of the substrate; and connecting a connection located on the first surface of the substrate between the first device and the second device.

In still another aspect, a non-transitory computer-readable medium comprising instructions that when executed by a processor cause the processor to perform a method, the method includes: providing a substrate; attaching a first device to a first surface of the substrate near a center of the substrate; attaching a second device to the first surface of the substrate near an edge of the substrate; and connecting a connection located on the first surface of the substrate between the first device and the second device.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The methods, apparatus, and systems disclosed herein mitigate shortcomings of the conventional methods, apparatus, and systems, as well as other previously unidentified needs. Among the various technical advantages the various aspects disclosed provide, in at least some aspects, the features of connection routing on top of a substrate surface with the routing going through empty space available between components and connects to component terminals to and from PMIC devices provides a novel structure to connect surface mount technology (SMT) passive device terminals on an SMT layer (such as a Cu bar mesh) that uses the 3D space available near to components to lower resistance/lower inductive path and provides a shorter path, SIP form factor reduction, a component placement density increase, creates an additional power delivery network (PDN) layer for connectivity and, if the routing is encapsulated in a mold, protects the metal in the connection from oxidation. Such as in an apparatus that includes: a substrate; a first device attached to a first surface of the substrate near a center of the substrate; a second device attached to the first surface of the substrate near an edge of the substrate; and a connection located on the first surface of the substrate, the connection coupled between the first device and the second device.

Figure 1:
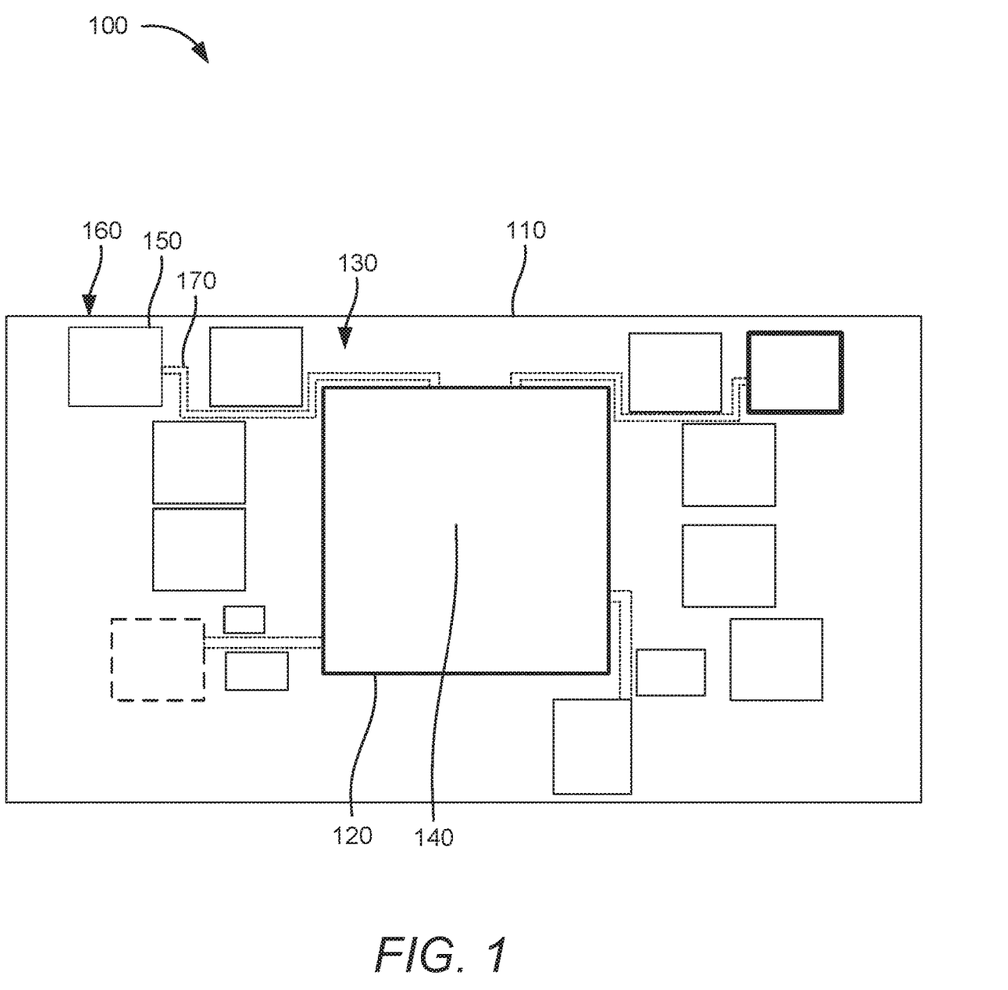
FIG. 1 illustrates a block diagram of connections between devices in accordance with some aspects of the disclosure.

FIG. 1 illustrates a block diagram of connections between devices in accordance with some aspects of the disclosure. As shown in FIG. 1, an apparatus 100 may include a substrate 110; a first device 120 (such as a memory, logic, passive, or an active device including a PMIC) attached to a first surface 130 of the substrate near a center 140 of the substrate 110; a second device 150 (such as a memory, logic, active, or passive device including an inductor) attached to the first surface 130 of the substrate 110 near an edge 160 of the substrate 110; and a connection 170 located on the first surface 130 of the substrate 110, the connection 170 coupled between the first device 120 and the second device 150. As can be seen, FIG. 1 illustrates that more or less than a single second device 150 and connection 170 may be used.

With regard to connection 170, may have a length parallel to the first surface 130 of the substrate 110, a width parallel to the first surface 130 of the substrate 110 and perpendicular to the length, and a height perpendicular to the length and the width, the height greater than the width. It should be understood that the connection 170 may be configured to transfer signals between the first device 120 and the second device 150. In addition, it should be understood that connection 170 may be composed of copper or similar conductive material, have a width of approximately 5 µm to 50 µm, a height of approximately 50 µm to 200 µm, and be one of a plate, wire, strip, bar, or mesh shape.

Figure 2:
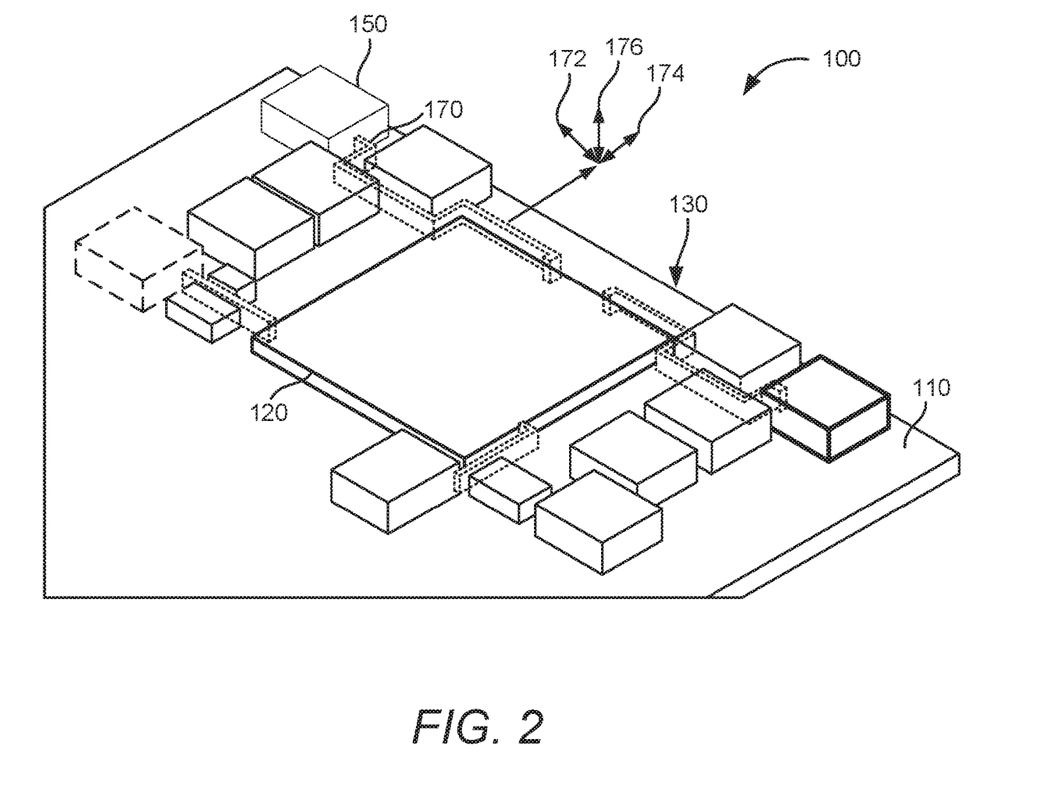
FIG. 2 illustrates a three dimensional (3D) view of connections between devices in accordance with some aspects of the disclosure.

FIG. 2 illustrates a three dimensional (3D) view of connections between devices in accordance with some aspects of the disclosure. As shown in FIG. 2, the connection 170 may have a length 172 parallel to the first surface 130 of the substrate 110, a width 174 parallel to the first surface 130 of the substrate 110 and perpendicular to the length 172, and a height 176 perpendicular to the length 172 and the width 174, the height 176 greater than the width 174 to increase the capacity/reduce the resistance. While FIG. 2 illustrates that the height 176 is the same or less than the height of the devices on the substrate 110, it should be understood that the height 176 may be greater than a height of any of the other elements on the substrate and, although shown as a plate, may be one of a plate, wire, strip, bar, mesh shape or similar.

Figure 3A:
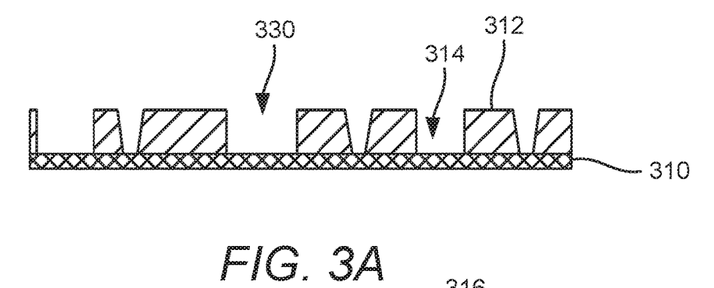
FIGS. 3A-G illustrate a method for manufacturing connections between devices in accordance with some aspects of the disclosure.
Figure 3B:
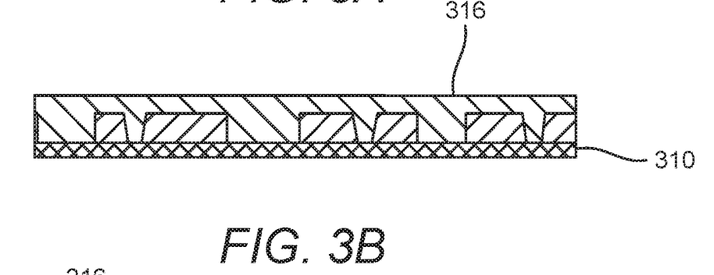
Figure 3C:
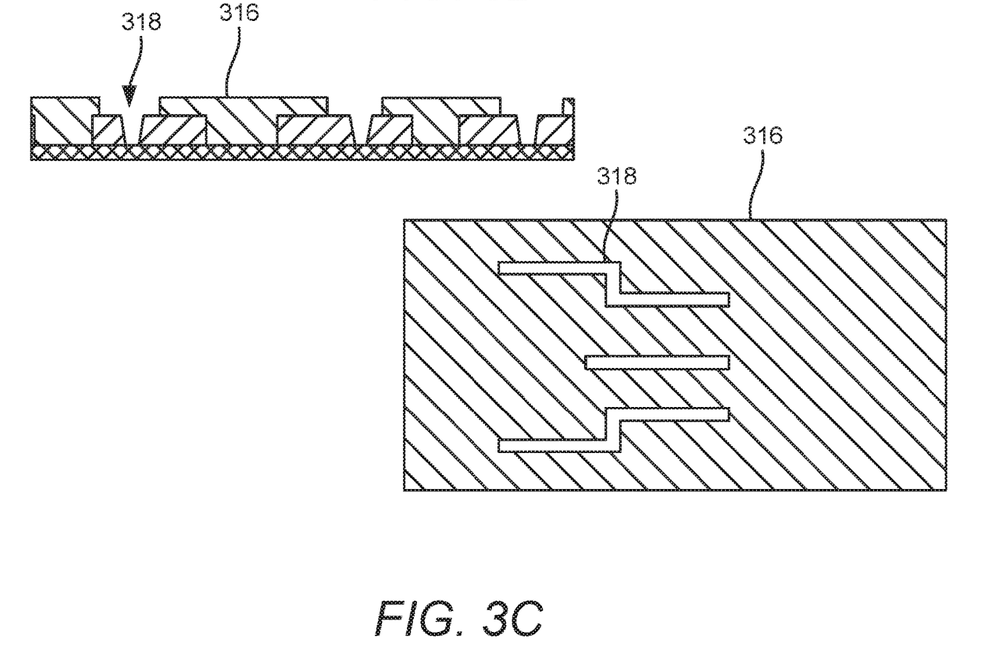

FIGS. 3A-G illustrate a method for manufacturing connections between devices in accordance with some aspects of the disclosure. As shown in FIG. 3A, the method may being with providing a substrate 310, applying a dielectric 312 (such as a photo-imageable dielectric or similar) to a first surface 330 of the substrate 310, and forming openings 314 in the dielectric 312 for placement of devices. The method may continue in FIG. 3B with applying a film 316 (such as a dry film) to encapsulate the substrate 310. The method may continue in FIG. 3C with forming opening 318 in the film 316.

Figure 3D:
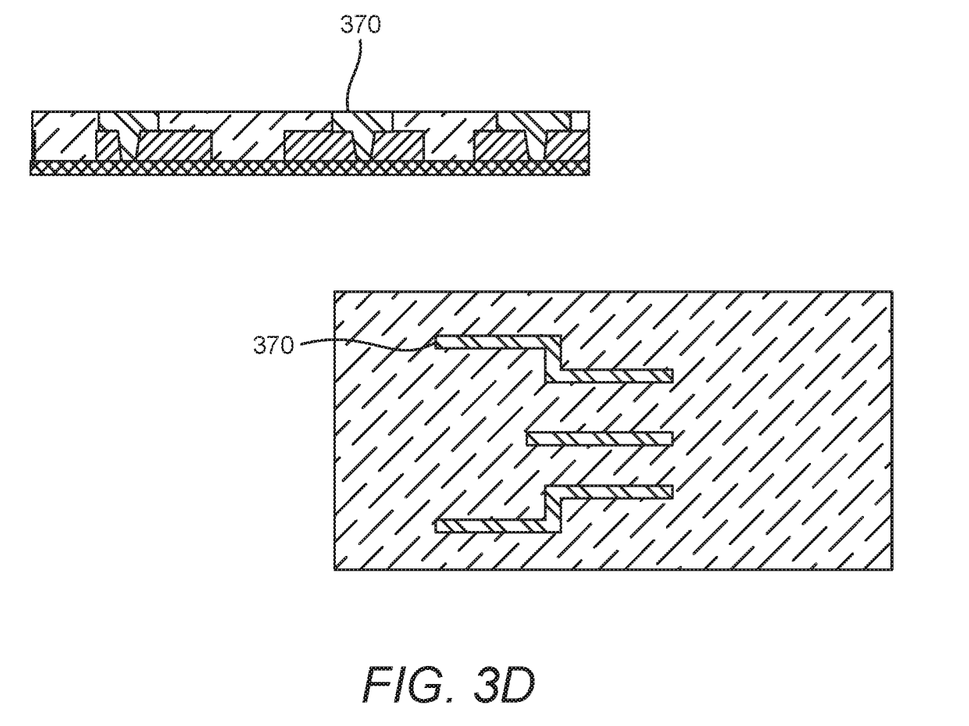
Figure 3E:
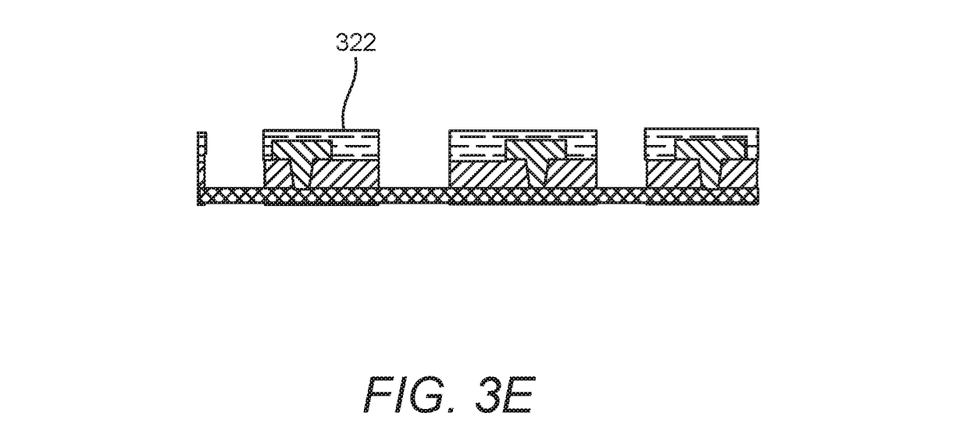
Figure 3F:
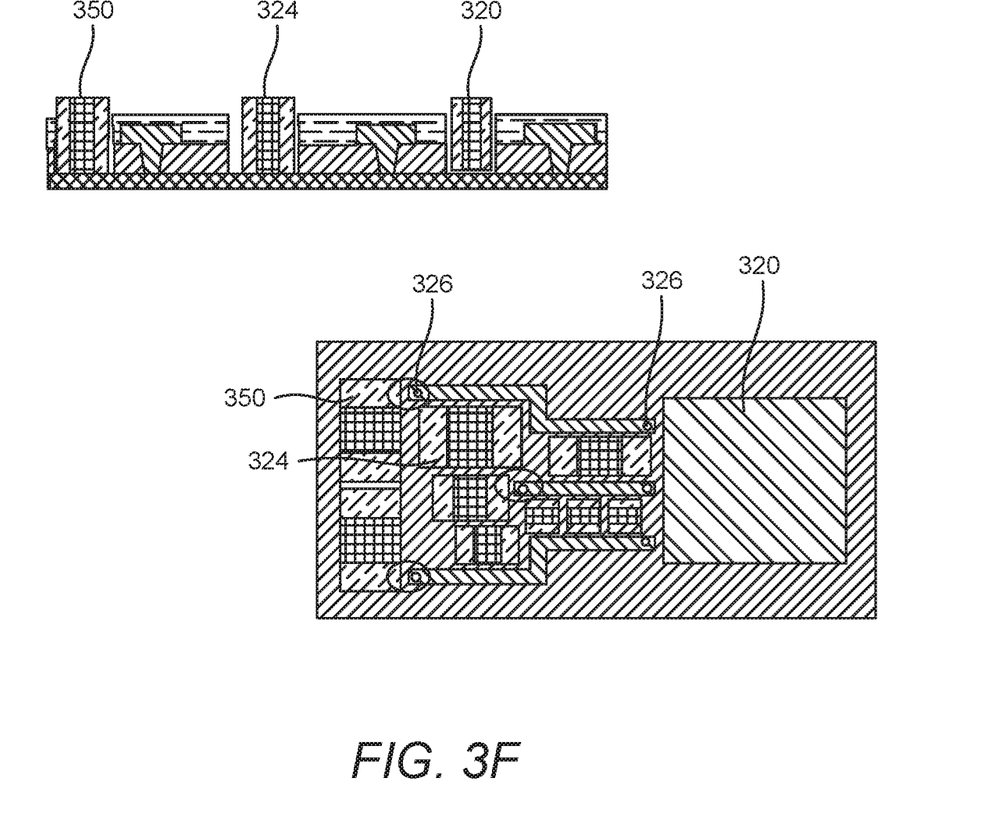
Figure 3G:
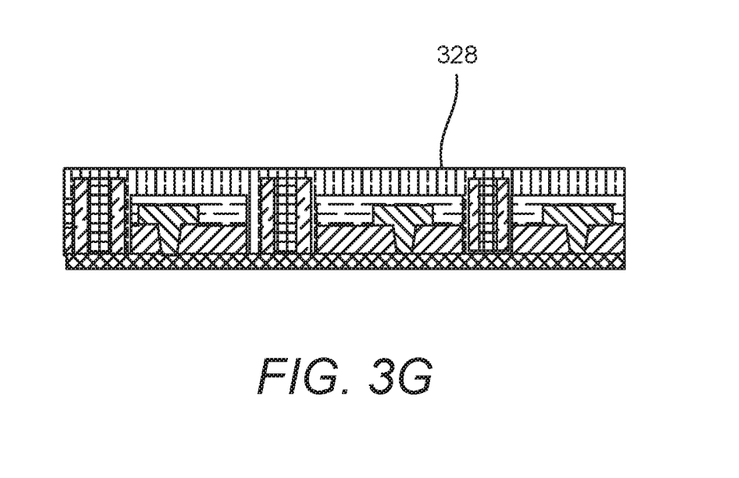

The method may continue in FIG. 3D with forming connections 370 in the openings 318 (such as by plating a copper or similar material). The method may continue in FIG. 3E with removing the film 316 and applying a solder resist film 322. The method may continue in FIG. 3F with attaching a first device 320 (such as first device 120), a second device 350 (such as second device 150), and a plurality of additional devices 324. The devices may be attached using surface mount technology (SMT) or similar techniques as well as conventional techniques to couple the connections 370 to a respective device. In addition, a plurality of vias 326 may be formed in the connections 370 extending through the connections 370 to the substrate 310. The method may conclude in FIG. 3G with encapsulating the substrate 310 with a mold compound 328 to protect the components on the substrate 310 from damage such as oxidation. It should be understood that additional steps may be included such as attaching external connections (such as a ball grid array) to the substrate, package singulation, and similar package processes.

Figure 4:
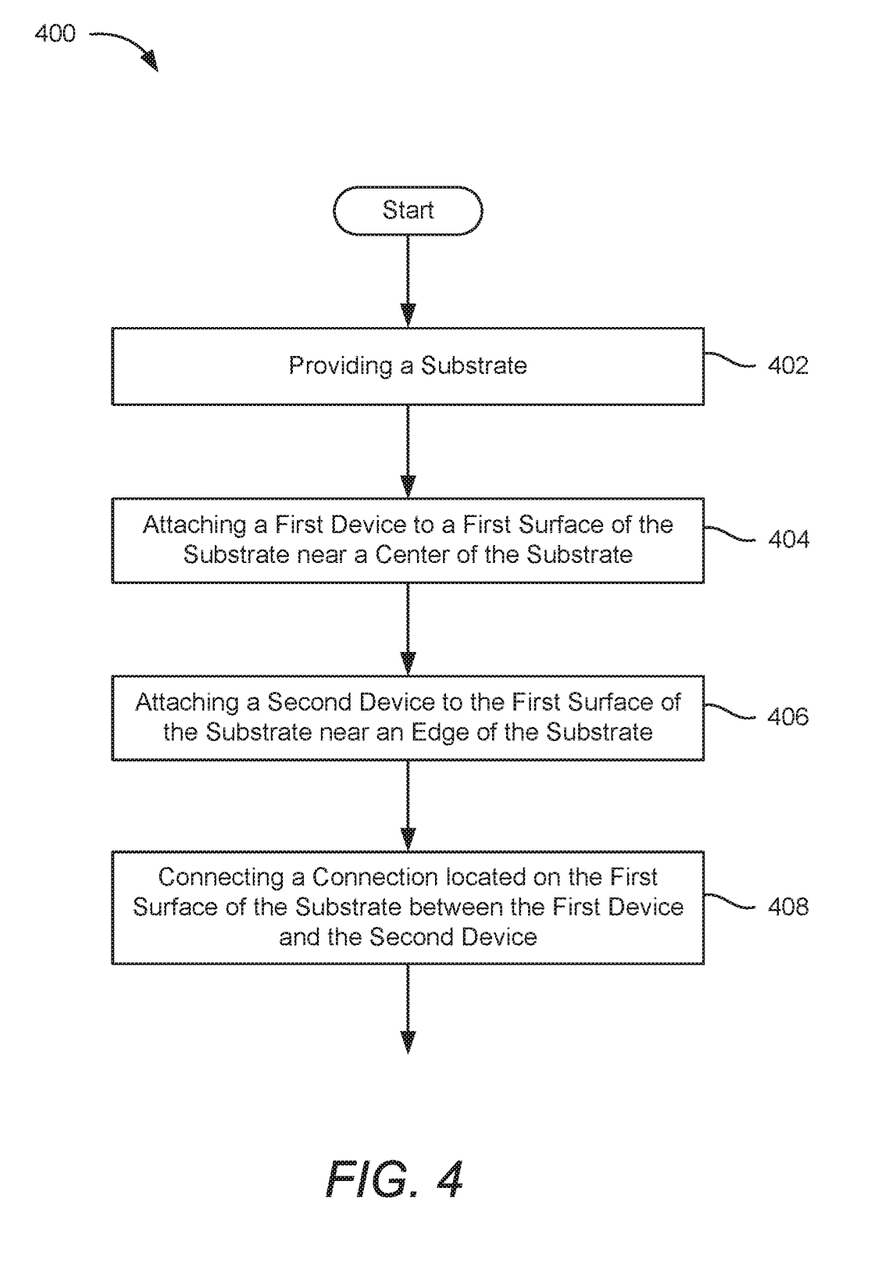
FIG. 4 illustrates a method for manufacturing an apparatus in accordance with some aspects of the disclosure.

FIG. 4 illustrates a method in accordance with some aspects of the disclosure. As shown in FIG. 4, the method 400 may begin in block 402 with providing a substrate. The method 400 may continue in block 404 with attaching a first device to a first surface of the substrate near a center of the substrate. The method 400 may continue in block 406 with attaching a second device to the first surface of the substrate near an edge of the substrate. The method 400 may conclude in block 408 with connecting a connection located on the first surface of the substrate between the first device and the second device. The method 400 may alternatively include incorporating the apparatus into a device selected from a group including a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Alternatively, the method 400 may include depositing a silicon nitride film before forming the shallow trench isolation region; masking an N-type metal-oxide-semiconductor (NMOS) region before etching the P-type metal-oxide-semiconductor (PMOS) spacer; wherein the source region and the drain region for the PMOS region and the NMOS region are epitaxial grown, and incorporating the transistor circuit into a device selected from the group including of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle. In addition, the method 400 may also include the following: the first device is a power management integrated circuit; the first device is a power management integrated circuit and the second device is a passive device; the first device is a power management integrated circuit and the second device is an inductor; or the connection has a length parallel to the first surface of the substrate, a width parallel to the first surface of the substrate and perpendicular to the length, and a height perpendicular to the length and the width, the height greater than the width or approximately 50 µm.

Figure 5:
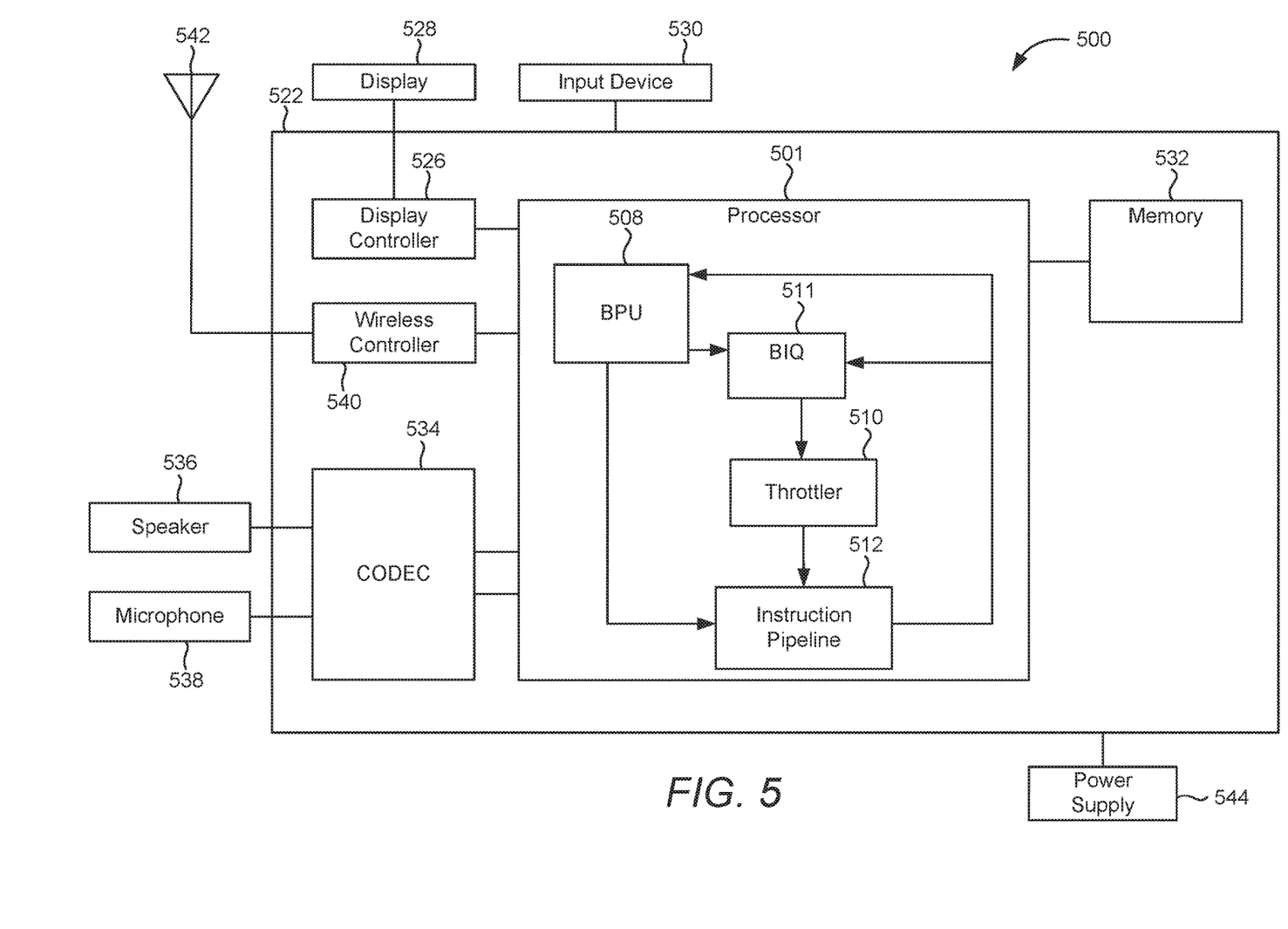
FIG. 5 illustrates a mobile device in accordance with some aspects of the disclosure.

FIG. 5 illustrates a mobile device in accordance with some aspects of the disclosure.

Referring now to FIG. 5, a block diagram of a mobile device that is configured according to some aspects is depicted and generally designated 500. In some aspects, mobile device 500 may be configured as a wireless communication device. As shown, mobile device 500 includes processor 501, which may be configured to implement the methods described herein in some aspects. Processor 501 is shown to include instruction pipeline 512, buffer processing unit (BPU) 508, branch instruction queue (BIQ) 511, and throttler 510. Other well-known details (e.g., counters, entries, confidence fields, weighted sum, comparator, etc.) of these blocks have been omitted from this view of processor 501 for the sake of clarity.

Processor 501 may be communicatively coupled to memory 532 over a link, which may be a die-to-die or chip-to-chip link. Mobile device 500 also include display 528 and display controller 526, with display controller 526 coupled to processor 501 and to display 528.

In some aspects, FIG. 5 may include coder/decoder (CO-DEC) 534 (e.g., an audio and/or voice CODEC) coupled to processor 501; speaker 536 and microphone 538 coupled to CODEC 534; and wireless controller 540 (which may include a modem) coupled to wireless antenna 542 and to processor 501.

In a particular aspect, where one or more of the above-mentioned blocks are present, processor 501, display controller 526, memory 532, CODEC 534, and wireless controller 540 can be included in a system-in-package or system-on-chip device 522. Input device 530 (e.g., physical or virtual keyboard), power supply 544 (e.g., battery), display 528, input device 530, speaker 536, microphone 538, wireless antenna 542, and power supply 544 may be external to system-on-chip device 522 and may be coupled to a component of system-on-chip device 522, such as an interface or a controller.

It should be noted that although FIG. 5 depicts a mobile device, processor 501 and memory 532 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
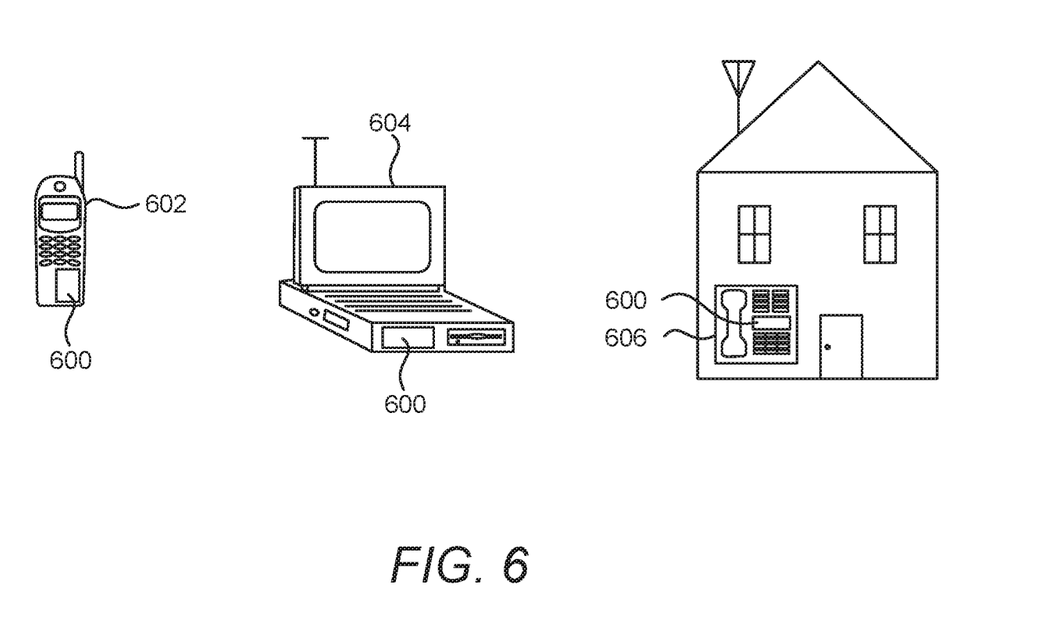
FIG. 6 illustrates various electronic devices that may be integrated with any of the aforementioned methods, devices, semiconductor devices, integrated circuits, die, interposers, packages, or package-on-packages (PoPs) in accordance with some aspects of the disclosure.

FIG. 6 illustrates various electronic devices that may be integrated with any of the aforementioned integrated device, semiconductor device, integrated circuit, die, interposer, package or package-on-package (PoP) in accordance with some aspects of the disclosure. In one aspect, a mobile phone device 602, a laptop computer device 604, and a fixed location terminal device 606 may include an integrated device 600 as described herein. The integrated device 600 may be any of the integrated circuits, dies, integrated devices, integrated device packages, integrated circuit devices, device packages, integrated circuit (IC) packages, package-on-package devices described herein. The devices 602, 604, 606 illustrated in FIG. 6 are only a few of the devices that feature the integrated device 600. Other electronic devices may also feature the integrated device 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. In one aspect, an apparatus may include a means for supporting (such as a substrate); a first device attached to a first surface of the means for supporting near a center of the means for supporting; a second device attached to the first surface of the means for supporting near an edge of the means for supporting; and means for connection (such as a connection) located on the first surface of the means for supporting, the means for connection coupled between the first device and the second device. It will be appreciated that the aforementioned aspects are merely provided to illustrate the features herein and the various aspects claimed are not limited to the specific references and/or illustrations cited.

One or more of the components, processes, features, and/or functions illustrated in FIGS. 1-6 may be rearranged and/or combined into a single component, process, feature or function or incorporated in several components, processes, or functions. Additional elements, components, processes, and/or functions may also be added without departing from the disclosure. It should also be noted that FIGS. 1-6 and its corresponding description in the present disclosure is not limited to dies and/or ICs. In some implementations, FIGS. 1-6 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (e.g. transistors, resistors, capacitors, inductors etc.), which perform the operation or function of the device. The backside of a device is the side of the device opposite the active side. As used herein, a metallization structures may include metal layers, vias, pads, or traces with dielectric between, such as a redistribution layer (RDL).

As used herein, the terms "user equipment" (UE), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wire line connection, or other connection, regardless of whether satellite signal reception, assistance data reception, and/or position-related processing occurs at the device or at the other device. In addition, these terms are intended to include all devices, including wireless and wire line communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on Institute of Electrical and Electronics Engineers (IEEE) 802.11, etc.) and so on. UEs can be embodied by any of a number of types of devices including but not limited to printed circuit (PC) cards, compact flash devices, external or internal modems, wireless or wire line phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The terminology used herein is for the purpose of describing particular aspects and is not intended to be limiting of aspects of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can include one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

The methods, sequences and/or algorithms described in connection with the aspects disclosed herein may be incorporated directly in hardware, in a software module executed by a processor, or in a combination of the two. A software module may reside in RAM memory, flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art including non-transitory types of memory or storage mediums. A storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as a microprocessor, a programmable computer or an electronic circuit. In some aspects, some or a plurality of the most important method actions can be performed by such an apparatus.

In the detailed description above it can be seen that different features are grouped together. This manner of disclosure should not be understood as an intention that the claimed aspects have more features than are explicitly mentioned in the respective claim. Rather, the disclosure may include fewer than all features of an individual aspect disclosed. Therefore, the following claims should hereby be deemed to be incorporated in the description, where each claim by itself can stand separate. Although each claim by itself can stand separate, it should be noted that—although a dependent claim can refer in the claims to a specific combination with one or a plurality of claims—other aspects can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some aspects, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative aspects of the disclosure, it should be noted that various changes and modifications could be made herein without departing from the scope of the disclosure as defined by the appended claims. The functions and/or actions of the method claims in accordance with the aspects of the disclosure described herein need not be performed in any particular order. Additionally, well-known elements will not be described in detail or may be omitted so as to not obscure the relevant details of the aspects disclosed herein. Furthermore, although elements of the disclosure may be described or claimed in the singular, the plural is contemplated unless limitation to the singular is explicitly stated.

What is claimed is:

1. An apparatus comprising:
a substrate;
a first device attached to a first surface of the substrate near a center of the substrate;
a second device attached to the first surface of the substrate near an edge of the substrate; and
a connection located on the first surface of the substrate, the connection coupled between the first device and the second device,
wherein the connection has a length parallel to the first surface of the substrate, a width parallel to the first surface of the substrate and perpendicular to the length, and a height perpendicular to the length and the width, wherein the height is uniform throughout the connection, and
wherein the height is greater than the width.

2. The apparatus of claim 1, wherein the first device is an active device.

3. The apparatus of claim 1, wherein the first device is an active device and the second device is a passive device.

4. The apparatus of claim 1, wherein the first device is one of an active device or a passive device and the second device is one of an active device or a passive device.

5. The apparatus of claim 1, wherein the height is greater than 50 μm.

6. The apparatus of claim 1, wherein the apparatus is incorporated into a device selected from a group including a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

7. An apparatus comprising:
means for supporting;
a first device attached to a first surface of the means for supporting near a center of the means for supporting;
a second device attached to the first surface of the means for supporting near an edge of the means for supporting; and
means for coupling located on the first surface of the means for supporting, the means for coupling coupled between the first device and the second device,
wherein the means for coupling includes a connection that has a length parallel to the first surface of the means for supporting, a width parallel to the first surface of the means for supporting and perpendicular to the length, and a height perpendicular to the length and the width,
wherein the height is uniform throughout the connection, and
wherein the height is greater than the width.

8. The apparatus of claim 7, wherein the first device is an active device.

9. The apparatus of claim 7, wherein the first device is an active device and the second device is a passive device.

10. The apparatus of claim 7, wherein the first device is one of an active device or a passive device and the second device is one of an active device or a passive device.

11. The apparatus of claim 7, wherein the height is greater than 50 μm.

12. The apparatus of claim 7, wherein the apparatus is incorporated into a device selected from a group including a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

13. A method for manufacturing an apparatus, the method comprising:
providing a substrate;
attaching a first device to a first surface of the substrate near a center of the substrate;
attaching a second device to the first surface of the substrate near an edge of the substrate; and
connecting a connection located on the first surface of the substrate between the first device and the second device,
wherein the connection has a length parallel to the first surface of the substrate, a width parallel to the first surface of the substrate and perpendicular to the length, and a height perpendicular to the length and the width,
wherein the height is uniform throughout the connection, and
wherein the height is greater than the width.

14. The method of claim 13, wherein the first device is an active device.

15. The method of claim 13, wherein the first device is an active device and the second device is a passive device.

16. The method of claim 13, wherein the first device is one of an active device or a passive device and the second device is one of an active device or a passive device.

17. The method of claim 13, wherein the height is greater than 50 μm.

18. The method of claim 13, further comprising incorporating the apparatus into a device selected from a group including a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

19. A non-transitory computer-readable medium comprising instructions that when executed by a processor cause the processor to perform a method, the method comprising:
providing a substrate;
attaching a first device to a first surface of the substrate near a center of the substrate;
attaching a second device to the first surface of the substrate near an edge of the substrate; and
connecting a connection located on the first surface of the substrate between the first device and the second device,
wherein the connection has a length parallel to the first surface of the substrate, a width parallel to the first surface of the substrate and perpendicular to the length, and a height perpendicular to the length and the width,
wherein the height is uniform throughout the connection, and
wherein the height is greater than the width.

20. The non-transitory computer-readable medium of claim 19, wherein the first device is an active device.

21. The non-transitory computer-readable medium of claim 19, wherein the first device is an active device and the second device is a passive device.

22. The non-transitory computer-readable medium of claim 19, wherein the first device is one of an active device or a passive device and the second device is one of an active device or a passive device.

23. The non-transitory computer-readable medium of claim 19, wherein the height is greater than 50 μm.

24. The non-transitory computer-readable medium of claim 19, wherein the method further comprises incorporating the substrate into a device selected from a group including a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

25. The apparatus of claim 1, wherein an upper surface of the connection is farther from the first surface of the substrate than a lower surface of the first device.

26. The apparatus of claim 7, wherein an upper surface of the connection is farther from the first surface of the means for supporting than a lower surface of the first device.

27. The method of claim 13, wherein an upper surface of the connection is farther from the first surface of the substrate than a lower surface of the first device.

28. The non-transitory computer-readable medium of claim 19, wherein an upper surface of the connection is farther from the first surface of the substrate than a lower surface of the first device.

* * * * *